(12) United States Patent
Choi et al.

(10) Patent No.: US 6,528,841 B2
(45) Date of Patent: Mar. 4, 2003

(54) NAND TYPE FLASH MEMORY DEVICE HAVING DUMMY REGION

(75) Inventors: Eun-Young Choi, Kyunggi-do (KR); Jung-Dal Choi, Kyunggi-do (KR); Jae-Duk Lee, Kyunggi-do (KR); Hong-Soo Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/995,501

(22) Filed: Nov. 26, 2001

(65) Prior Publication Data

US 2002/0096705 A1 Jul. 25, 2002

(30) Foreign Application Priority Data

Jan. 9, 2001 (KR) .......................................... 2001-1102

(51) Int. Cl.[7] ............................................. H01L 29/788
(52) U.S. Cl. ........................ 257/315; 257/314; 257/316; 257/390; 365/185.11; 365/185.17
(58) Field of Search ....................... 365/185.17, 185.11; 257/315, 316, 319, 369, 390, 208

(56) References Cited

U.S. PATENT DOCUMENTS 5,945,717 A * 8/1999 Chevallier .................. 257/390
6,376,876 B1 * 4/2002 Shin et al. .................. 257/315

FOREIGN PATENT DOCUMENTS

JP  05343647 A  * 12/1993  .................. 257/315
JP  2000357574 A  * 12/2000

* cited by examiner

*Primary Examiner*—Eddie Lee
*Assistant Examiner*—Matthew C. Landau
(74) *Attorney, Agent, or Firm*—Marger Johnson & McCollom, P.C.

(57) ABSTRACT

A NAND type flash memory device has a dummy region forming a dummy pattern. In the flash memory device, a common source line is formed to cross only with an isolation layer adjacent an active region of a normal pattern forming memory cells.

11 Claims, 11 Drawing Sheets

NAND TYPE FLASH MEMORY DEVICE HAVING DUMMY REGION

This application relies for priority upon Korean Patent Application No. 2001-1102, filed on Jan. 9, 2001, the contents of which are herein incorporated by reference in their entirety.

FIELD OF THE INVENTION

The present invention relates to a NAND type flash memory device, and more particularly to a NAND type flash memory device having dummy region.

BACKGROUND OF THE INVENTION

A flash memory device is a kind of nonvolatile memory device in which data bits are concurrently erased from all of the memory cells or one of the memory cell blocks. Flash memory devices are generally classified into NOR and NAND types according to the composition. The NAND type memory device is formed to have one string as a unit. In one string, 8, 16, or 32 memory cell transistors are formed one after another. Also, in each string, a bit line contact is formed at a drain region of a string select line and a common source line is in contact with a source region of a ground select line. Thus, there are no contacts between the memory cell transistors adjacent along an active region in one string. This is advantageous to increase the integration density of the memory device compared with a dynamic random access memory (DRAM) device.

Owing to line resistance, gate lines including the string select line, the ground select line, and the common source line in the flash memory device are not continuously formed over the whole chip, but are divided into several blocks, each of which is designed to be supplied with same voltage. Also, to increase conductivity, the string select line or the ground select line does not have a double gate structure having a floating gate and a control gate, but has a dummy gate line formed of a control gate layer and a lower gate line connected at given intervals with the dummy gate line through contacts. By reason of the same, line shaped portions of an isolation layer and line shaped sub-regions of an active region defined by means of the isolation layer do not have the same width in all areas, but have different widths in some areas.

FIG. 1 is a top plan view showing a potion of a cell area of a conventional NAND type flash memory device. As shown in FIG. 1, the cell area of the flash memory device includes a NAND cell unit in which a string select gate line SSL, plural word lines WL1–WLN, and a ground select gate line GSL are arranged in order in a longitudinal direction of an active region. The active region overlapped with bit lines BL is defined to repeatedly dispose strings in a longitudinal direction of the word lines by means of an isolation layer. The isolation layer STI has plural narrow portions STIs and a wide portion STIL. On the wide portion STIL of the isolation layer STI, butted contacts BC are formed.

In forming of the cell area of the flash memory device shown in FIG. 1, an isolation layer is first formed on a substrate to form an active region by using a shallow trench isolation (STI) process. The active region comprises a plurality of line shaped sub-regions which are defined respectively by a plurality of elongated openings or gaps of an isolation layer STI. In the STI process, photo-exposure process for forming trenches on the substrate is carried out. After the trenches are filled with the isolation layer, a pattern is obtained in which the line shaped sub-regions of the active region and plural narrow portions STIs and a wide portion STIL of the isolation layer are repeatedly arranged. However, under the influence of the wide portion STIL of the isolation layer, the line shaped sub-regions of the active region and the narrow portions STIs adjacent to the wide portion STIL of the isolation layer become had widths different from those remote therefrom. This variation may result in a decrease of the process margin as well as difficulty in device design, thereby decreasing the quality of the device.

Also, in case a chemical mechanical polishing (CMP) process is carried out in forming of the isolation layer, the wide portion STIL of the isolation layer is dented at the center thereof owing to a dishing phenomenon. The dented portion results in a problem such as forming step coverage in a subsequent process.

To solve these problems, in case there is any region or portion having wide width between the line shaped sub-regions of the active region or plural narrow portions of the isolation layer, a dummy region can be formed therebetween or in the middle thereof. FIG. 2 is a top plan view showing a portion of the NAND cell unit of the cell area of the conventional flash memory device in which a dummy region is formed.

Referring to FIG. 2, three line shaped sub-regions DA1 to DA3 of an active region adjacent to a wide portion STIL of an isolation layer and two narrow portion STIs of the isolation layer therebetween form a dummy region. In order to increase the integration density of the flash memory device, it is preferable that the isolation layer is formed by using a STI process. In the STI process, the isolation layer is formed by means of a chemical vapor deposition (CVD). However, in case the integration density of the flash memory device is increased, widths of the line shaped sub-regions or portions of the active region and the isolation layer have to be decreased, thereby to increase a ratio of length to width of trenches to be filled with the isolation layer. In this case, voids are apt to be formed in the isolation layer. In FIG. 2, it is shown that voids are generated in the narrow portions STIs of the isolation layer between the lined shaped sub-regions DA1 to DA3 of the active region forming the dummy region. After forming of isolation layer, a cleaning process removes an upper portion of the isolation layer in which the voids are formed, exposing the voids. The voids are filled with a silicon during forming of the silicon floating gate layer. However, when the silicon floating gate layer is etched to form the floating gate intermediate pattern, silicon in the voids is not etched well, so that a kind of wiring pattern 3 parallel to the active region is formed. At this time, what the wiring pattern 3 is connected with cell transistors corresponding to the word lines in the line shaped sub-regions of the active region forming the dummy region is worth little consideration since they will become dummy transistors. However, in case the wiring pattern 3 formed in the voids is crossed with the floating gate layer of the ground select line GSL and the active region in which the common source line CSL is to be formed, a short circuit between the ground select line GSL and the common source line CSL may be occurred. In FIG. 3 and FIG. 4, there is clearly illustrated that the wiring pattern 3 formed in the voids of the line shaped sub-regions STIs of the isolation layer is electrically connected with the ground select line GSL and the common source line CSL. Thus, the dummy region formed to prevent an abrupt change in width of given portions of the isolation layer from having influence on width of adjacent portions thereof during the optical lithography may result in another problem such as the short circuit between the ground select line GSL and the common source line CSL.

SUMMARY OF THE INVENTION

It is an object of the present invention to provide an improved NAND type flash memory device that is free of defects formed in the dummy region.

It is another object of the present invention to provide an improved NAND type flash memory device, which is free short circuit between a common source line and a ground select line due to voids formed in an isolation layer in a dummy region.

These and other objects are provided, according to the present invention, by a NAND type flash memory device having a dummy region forming a dummy pattern in which a common source line is formed to cross only with an isolation layer adjacent an active region of a normal pattern forming memory cells.

The NAND type flash memory device of the present invention includes an isolation layer having a plurality of line shaped portions formed parallel to each other on a substrate; an active region having a plurality of line shaped sub-regions defined by means of the isolation layer, each line shaped sub-region having a plurality of channel regions and a plurality of source/drain regions alternate with each other on the substrate in a cell area; a common source line connected electrically with at least one of the source/drain regions and one portion of the line shaped sub-regions of the active region, and crossing at least the one portion of the line shaped sub-regions of the active region; and a group of gate lines formed to cross the line shaped sub-regions of the active region, including ground select lines, a plurality of word lines, and string select lines arranged in order in a longitudinal direction of the line shaped sub-regions of the active region from the common source line, to form gate electrodes insulated from the channel regions by a gate insulating layer, in each of the channel regions on junction regions which crossed with the line shaped sub-regions of the active region. The other portion of the line shaped sub-regions of the active region is composed of a dummy region forming a dummy pattern, and the common source line is formed to cross only line shaped portions of the isolation layers which are in contact with the one portion of the line shaped sub-regions of the active region forming a normal pattern except the dummy pattern.

The flash memory device of the present invention further includes a plurality of bit lines connected through contacts with the one portion of the line shaped sub-regions of the active region forming the normal pattern on the opposite side of sides of the string select lines adjacent to the word lines, and arranged parallel to the one portion of the line shaped subregions of the active region. On the other portion of the line shaped sub-regions of the active region forming the dummy region there are no bit lines. However, united source wiring instead of the bit lines can be formed on one line shaped sub-region of the active region forming the dummy pattern adjacent to the normal pattern. The common source line is extended to the one line shaped sub-region of the active region adjacent to the normal pattern. A contact hole for the united source wiring is formed in the additional insulating layer at a region in which the common source line is crossed with the one line shaped sub-region of the active region forming the dummy pattern to be filled when the conductive layer for forming the bit lines is deposited, so that a contact connecting the common source line with the united source wiring is formed.

The line shaped sub-regions of the active region are divided into a plurality of blocks, and the dummy region is formed at both sides of the blocks. Also, the blocks are divided on the basis of the line shaped portions of the isolation layer having wide widths on which butted contacts are formed.

In the flash memory device of the present invention, the number of the word lines is one selected from 8, 16, and 32. Also, the common source line is formed of a wall shape having a lower end which is in contact with the one portion of the line shaped sub-regions of the active region and the line shaped portions of the isolation layer between or adjacent to the one portion of the line shaped sub-regions of the active region at a region in which the common source line is formed. The isolation layer can be formed by using CVD process through STI process. The ground select lines are formed by patterning the same polysilicon layer as that of floating gates of the word line.

In the flash memory device of the present invention, width of the line shaped portions or sub-regions of the isolation layer or the active region of the dummy pattern adjacent to the normal pattern is narrower than that of the dummy pattern remote from the normal pattern to be almost the same as that of the normal pattern.

DETAILED DESCRIPTION OF PREFERRED EMBODIMENTS

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be through and complete, and will fully convey the scope of the invention to those skilled in the art. Like numbers refer to like elements throughout.

Figure 1:
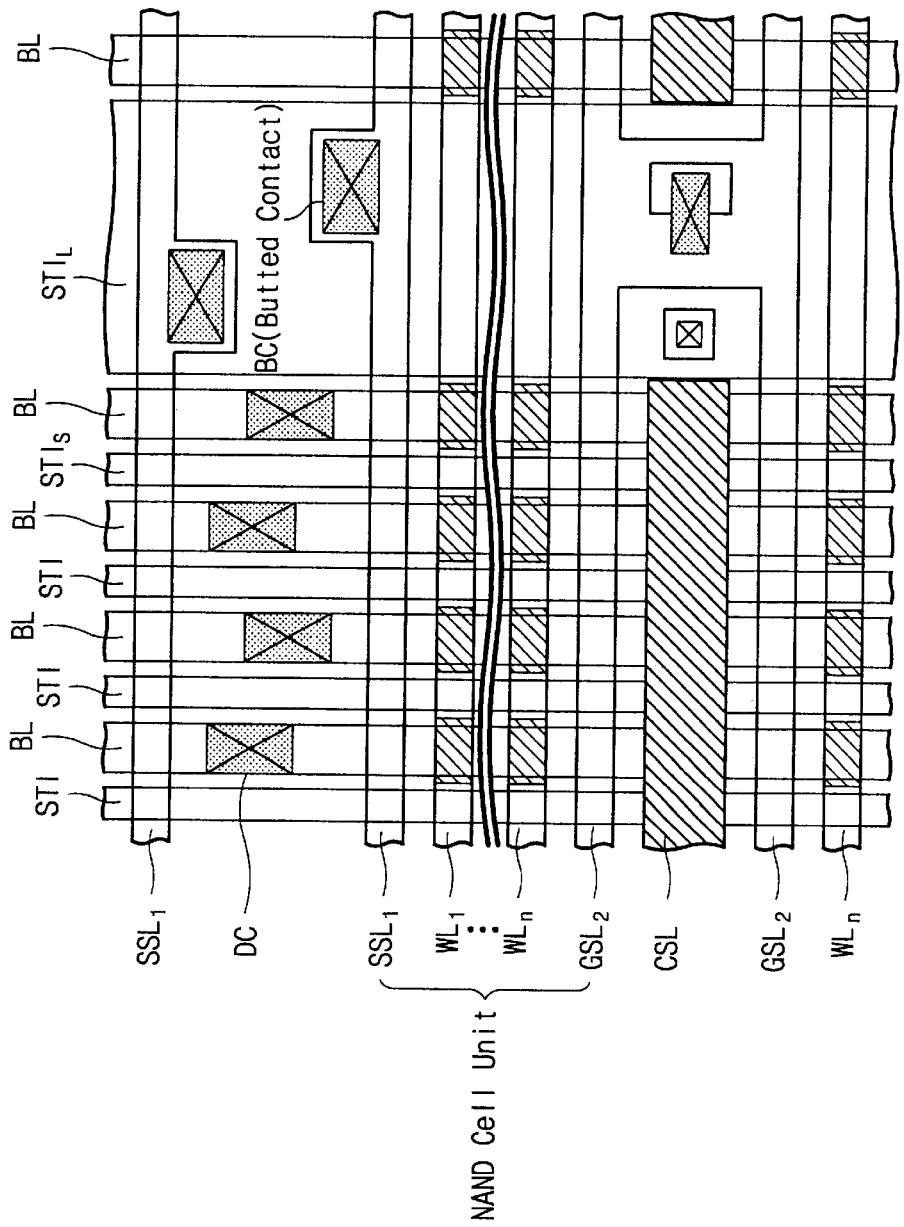
FIG. 1 is a top plan view showing a portion of a cell area of a conventional NAND type flash memory.
Figure 2:
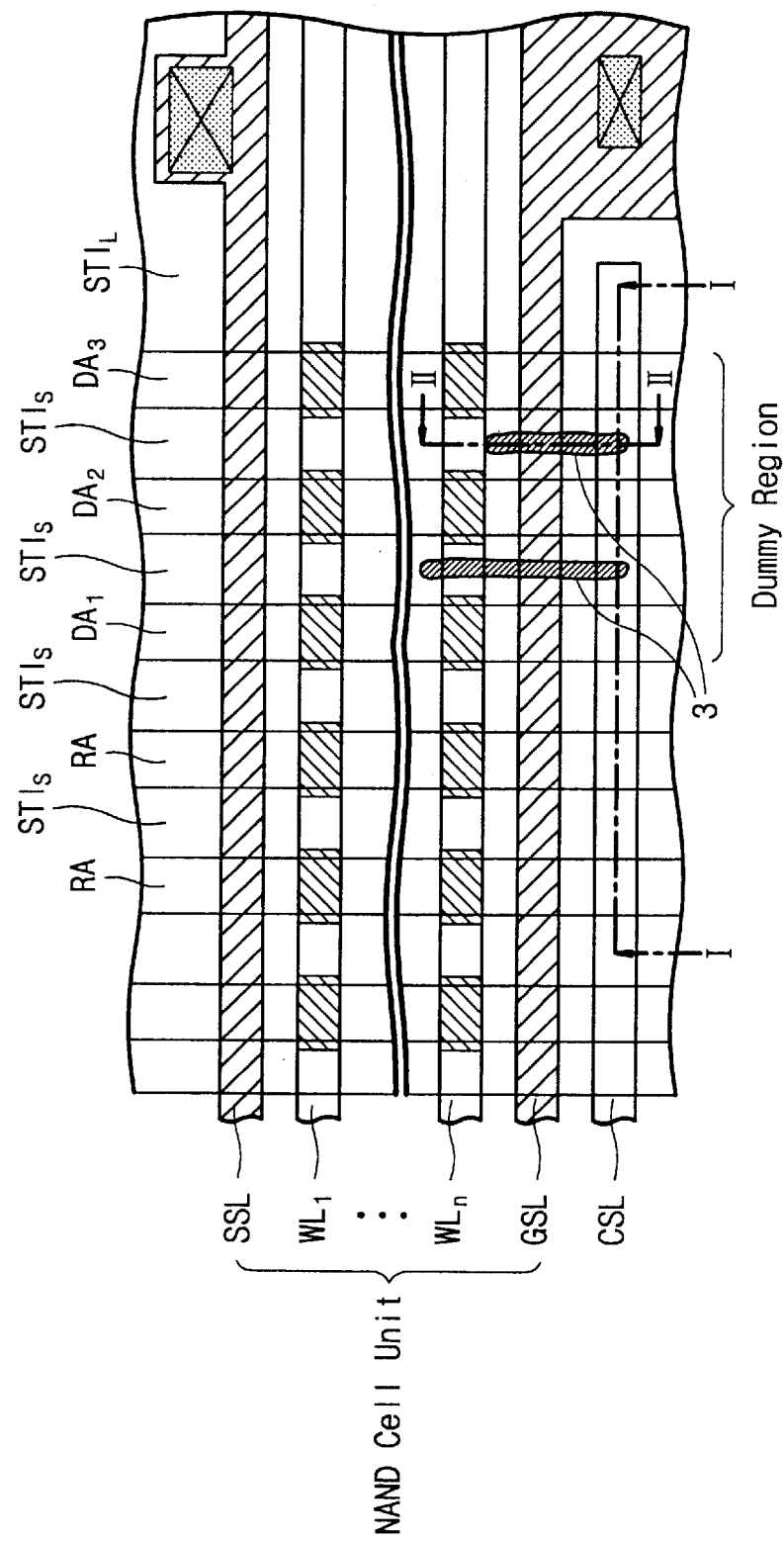
FIG. 2 is a top plan view showing a portion of a NAND cell unit of the cell area of the conventional flash memory device in which a dummy region is formed.
Figure 3:
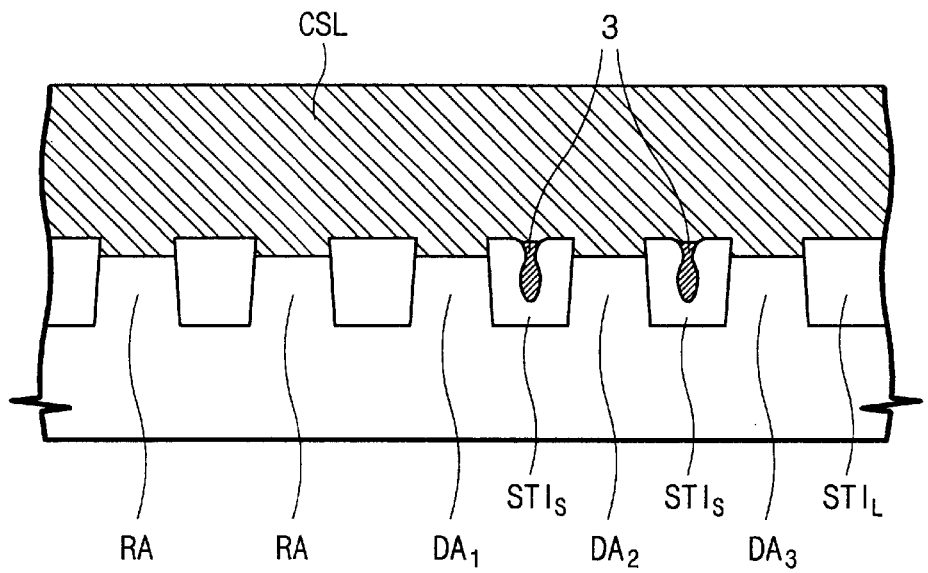
FIG. 3 is a cross-sectional view taken along line I—I in FIG. 2.
Figure 4:
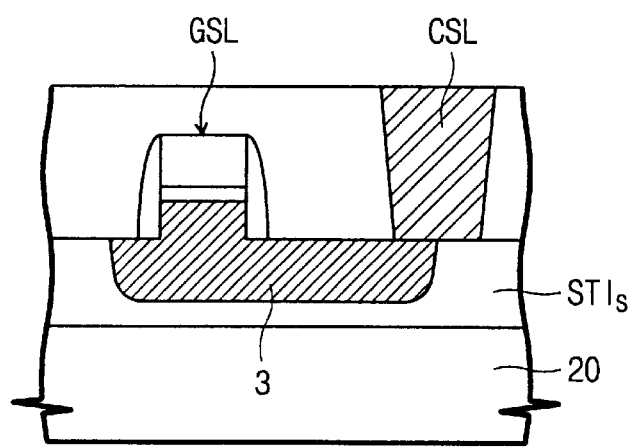
FIG. 4 is a cross-sectional view taken along line II—II in FIG. 2.
Figure 5:
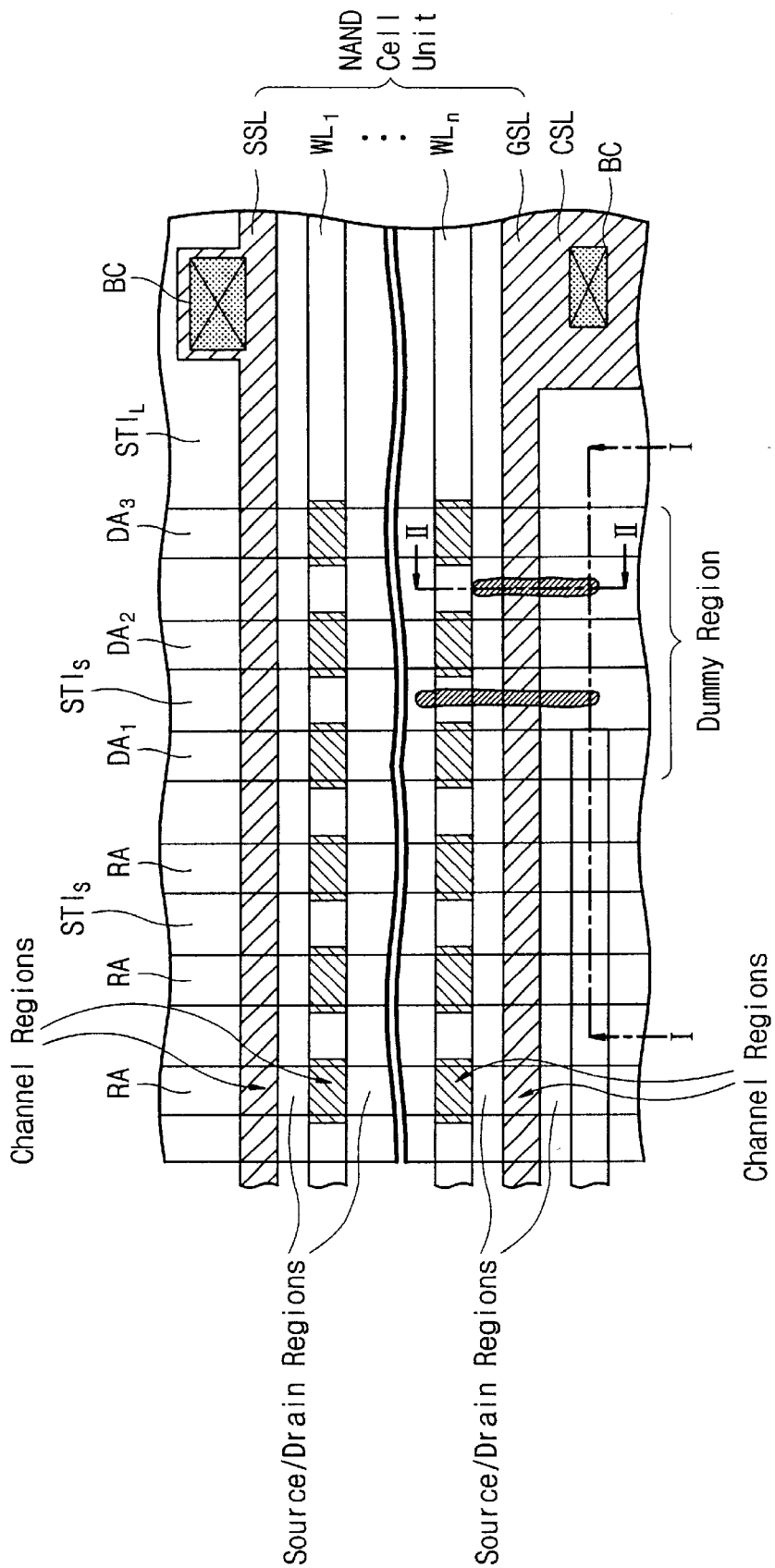
FIG. 5 is a top plan view showing a portion of a NAND cell unit of a cell area of a NAND type flash memory device in accordance with one embodiment of the present invention.

FIG. 5 shows a potion of a NAND cell unit of a cell area of a NAND type flash memory device in accordance with one embodiment of the present invention.

Figure 6:
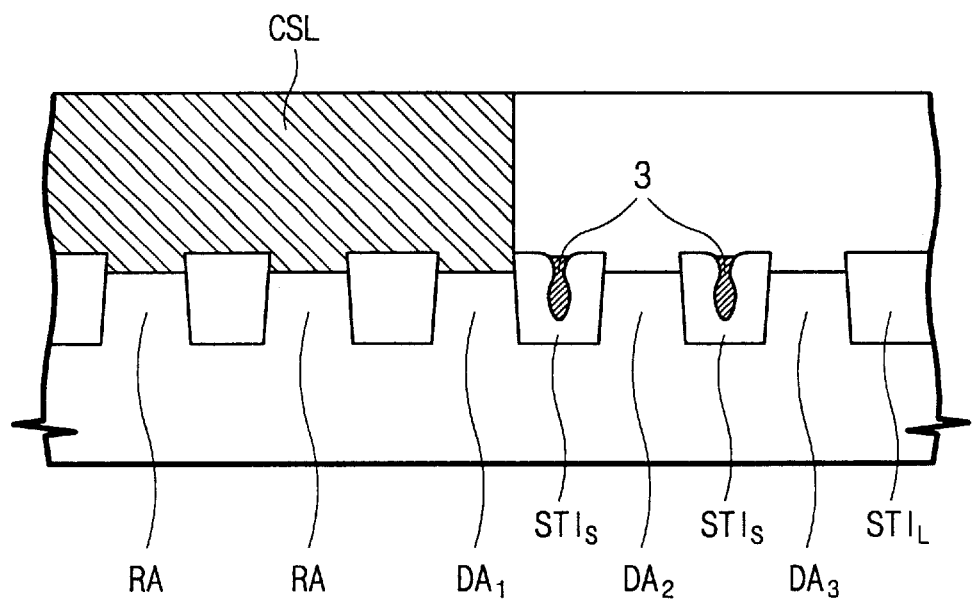
FIG. 6 is a cross-sectional view taken along line I—I of FIG. 5.
Figure 7:
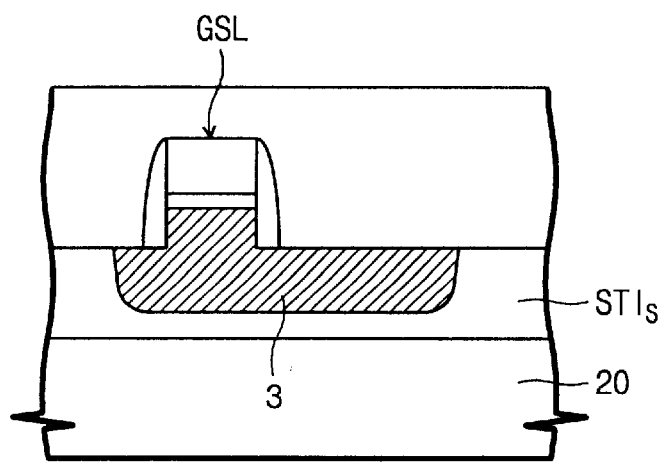
FIG. 7 is a cross-sectional view taken along line II—II of FIG. 5.

FIG. 6 and FIG. 7 are cross-sectional views taken respectively along lines I—I and II—II of FIG. 5 and show the process steps of a method of forming a common source line of the flash memory device.

Referring now to FIG. 5 to FIG. 7, the flash memory device of the present invention has an active region formed on a substrate in a cell area by means of an isolation layer STI. The active region comprises a plurality of line shaped sub-regions RA, DA which are defined respectively by a plurality of narrow and wide portion STIs, STIL of the isolation layer STI. In a NAND cell unit of the cell area of the flash memory device, a plurality of gate lines comprising a string select gate line SSL, a plurality of word lines WL, and a ground select gate line GSL are formed to cross the line shaped sub-regions RA, DA of the active region. Bit line contacts for connecting bit lines are formed in the active region on the opposite side of a side of the string select line SSL adjacent to the word lines WL. As shown in FIG. 5, butted contacts BC are formed in portions of the string select line SSL and the ground select line GSL having wider widths which are positioned on the wide portion STIL of the isolation layer STI.

Figure 12:
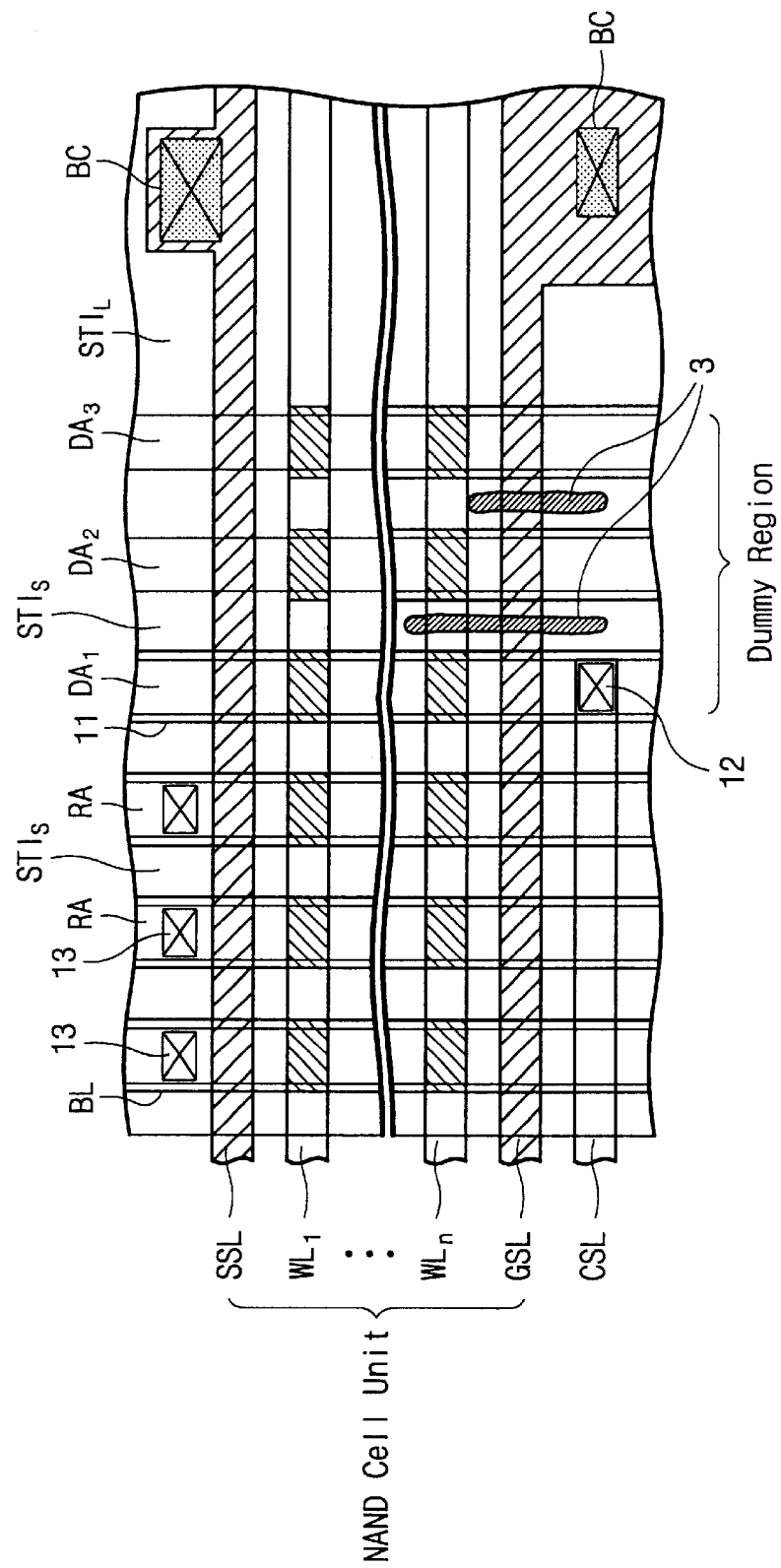

Three line shaped sub-regions DA1 to DA3 of the active region adjacent to the wide portion STIL of the isolation layer STI, and two narrow portions STIs of the isolation layer STI therebetween form a dummy region. A common source line CSL is formed parallel to the gate lines on the opposite side of a side of the ground select line GSL adjacent to the word lines WL. The common source line CSL is not formed in dummy region, but if necessary, in a portion of the dummy region. For example, in order to obtain a space for forming a contact 12 connected with united source wiring 11 as shown in FIG. 12, the common source line CSL can be formed to be extended to the line shaped sub-regions DA1 of the active region in the dummy region.

Thus, even though a wiring pattern is formed in the isolation layer because of voids generated in the isolation layer in the dummy region, it is not in contact with the common source line as shown in FIG. 7. Accordingly, a short circuit between the common source line CSL and the ground select line GSL is prevented.

A method of manufacturing a NAND type flash memory device of the present invention shown in FIG. 5 to FIG. 7 will now be described with reference to FIG. 8 to FIG. 13.

Figure 8:
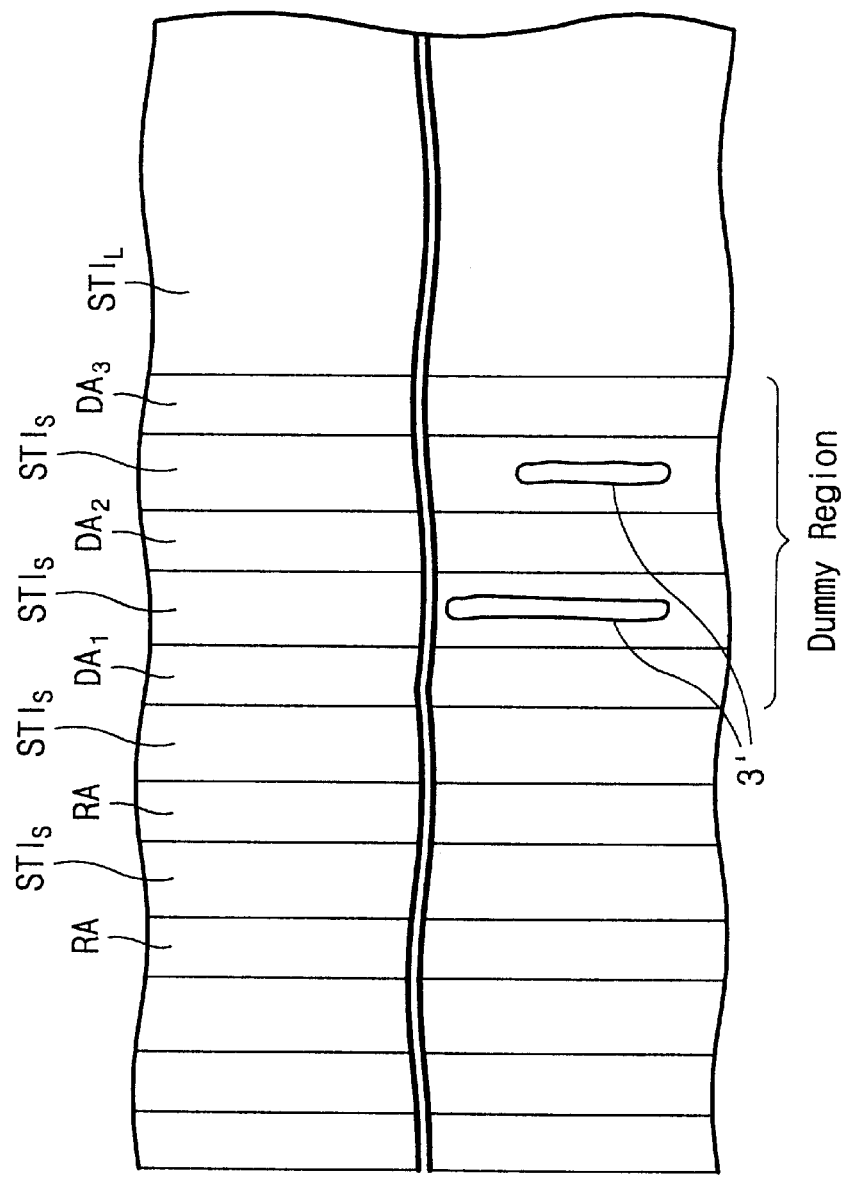
FIG. 8 to FIG. 12 are flow diagrams showing the process steps of a method of manufacturing the portion of the NAND cell unit of the cell area of the NAND type flash memory device shown in FIG. 5.

Referring to FIG. 8, first, an isolation layer STI is formed on a substrate to form an active region. The active region comprises a plurality of line shaped sub-regions RA, DA which are defined respectively by a plurality of narrow and narrow portions STIs, STIL of the isolation layer STI. The isolation layer is formed by a shallow trench isolation (STI) process. The STI process is carried out by forming trenches on the substrate by means of an etching process and filling the trenches with a CVD oxide layer. However, in case of using a self-aligned STI process, a portion of a gate insulating layer and a floating gate silicon layer can be deposited before forming of the isolation layer. In a cell area, the isolation layer and the active region are disposed to alternate each other. A given number of line shaped sub-regions of the active region form a block. Between blocks, a wide portion STIL of the isolation layer is formed. Three line shaped sub-regions DA1 to DA3 of the active region adjacent to the wide portion STIL of the isolation layer are formed as a dummy region forming a dummy pattern.

Figure 9:
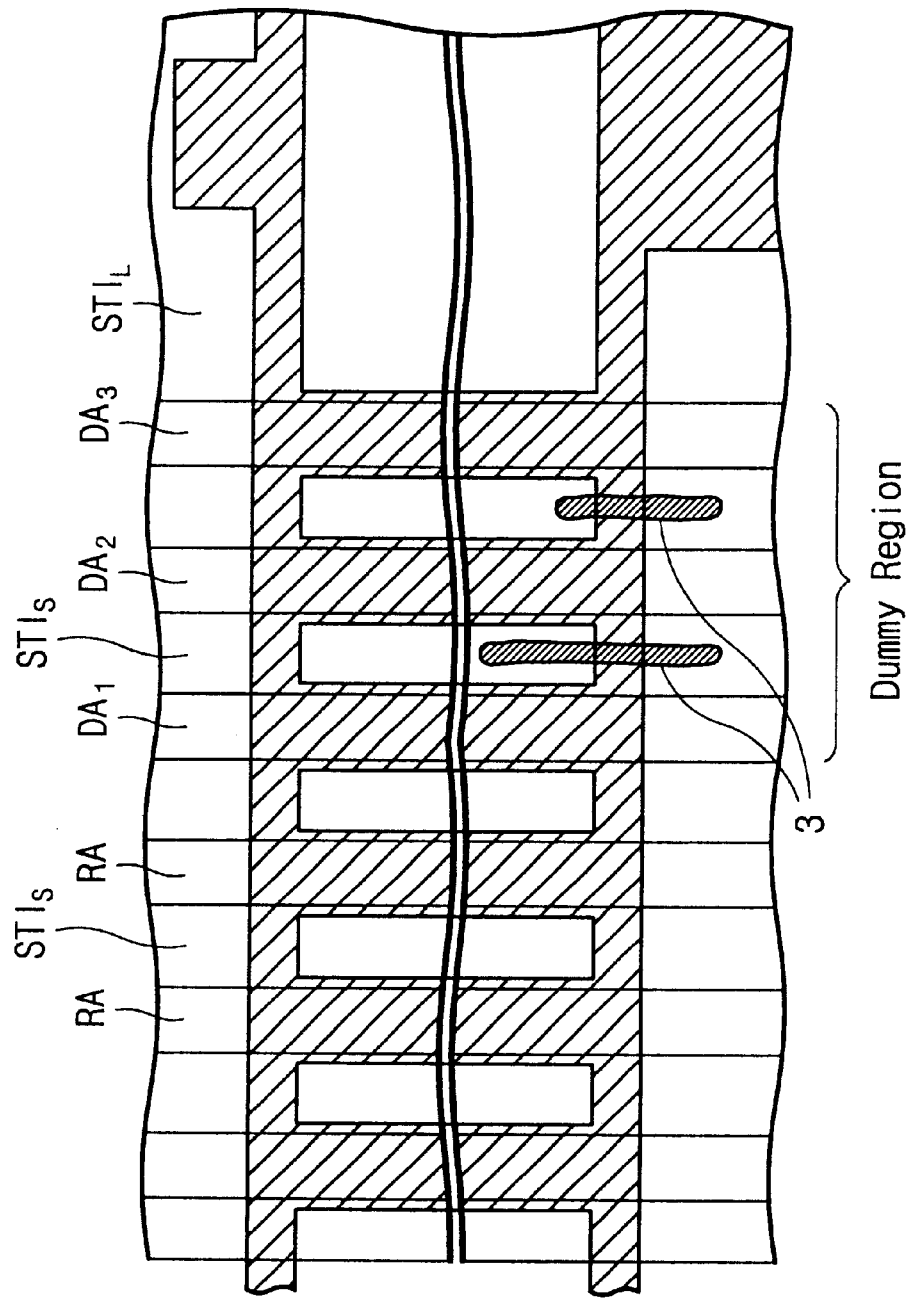

Referring to FIG. 9, a thin gate insulating layer is formed on the active region of the substrate on which the isolation layer is formed. On the gate insulating layer, a silicon floating gate layer is formed and patterned to form a floating gate intermediate pattern (a hatched portion in FIG. 9). At this time, a portion of the silicon floating gate layer overlapped parallel to the line shaped sub-regions DA, RA of the active region is remained as it is. However, a portion of the silicon floating gate layer on the isolation layer STI of the rest except a region on which the ground select line and the string select line is to be formed is removed, so that the remaining portion of the silicon floating gate layer forms a continuous line shaped pattern crossing with the line shaped sub-regions DA, RA of the active region.

On the other hand, supposing that in forming of the isolation layer, voids 3' are formed in the narrow portions STIs of the isolation layer as shown in FIG. 8. An upper portion of the isolation layer in which the voids are formed is removed to expose the voids 3' when a cleaning process after forming of the isolation layer is carried out. The voids 3' are filled with silicon during forming of the silicon floating gate layer. As shown in FIG. 9, when the floating gate intermediate pattern is formed, silicon in the voids is not removed completely so that a potential wiring pattern 3 is formed. The potential wiring pattern 3 is connected with the floating gate intermediate pattern over the substrate since the floating gate layer is not removed from the active region of the ground select line.

Figure 10:
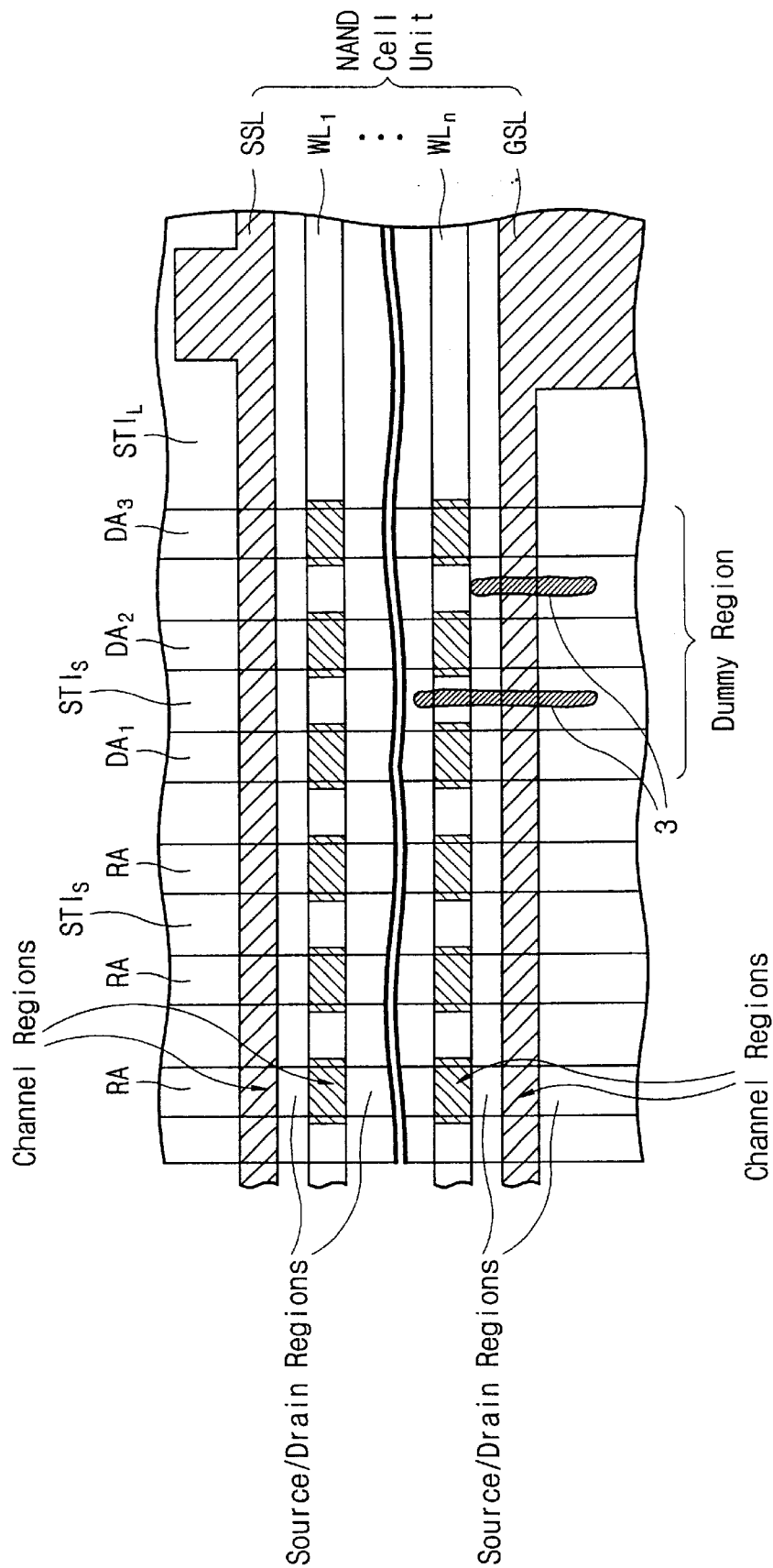

Referring to FIG. 10, a dielectric layer and a silicon control gate layer are formed over the whole surface of the substrate over which the floating gate intermediate pattern is formed. The dielectric layer generally uses an oxide nitride oxide (ONO) layer. The silicon control gate layer uses a doped polysilicon layer to increase conductivity. Then, a plurality of gate lines comprising a string select line SSL, plural word lines, and a ground select line are formed in order in a direction vertical to a direction which the active region is formed, by etching partially the silicon control gate layer, the dielectric layer, and the intermediate pattern. At this time, a string select line SSL, plural word lines, and a ground select line form a NAND cell unit in the cell area of the NAND type flash memory device.

On regions which the gate lines are crossed with the active region, gate electrode composed of the floating gate layer, the dielectric layer and the silicon control gate layer is formed. Particularly, the word lines WL among the gate lines form a plurality of gate electrodes, each having a typical double-layered gate structure of a nonvolatile memory device forming a transistor on each of junction regions which the word lines are crossed with the line shaped sub-regions of the active regions. The double-layered gate structure is composed of a floating gate, a dielectric layer, and a control gate formed in order on a gate insulating layer separating the gate electrodes from the active region. In forming of the gate lines, the gate insulating layer in the active regions between the gate lines is removed by means of a patterning process or remained as a buffer layer for ion implantation. Then, an ion implantation for forming source/drain regions is carried out. In the ion implantation, the exposed active region between the gate lines is lightly implanted once before spacers are formed on both sides of the gate lines, and highly implanted once thereafter. Thus, the source/drain regions having dual doped structures are formed. Namely, highly doped portions are formed in the active region of the substrate between the adjacent spacers, and lightly doped portions in the active region under the spacer. After the ion implantation, an etch stop layer can be deposited.

An upper portion of the potential wiring pattern 3 formed in the voids 3' is removed partially in forming of the floating gate intermediate pattern. However, it is possible for the potential wiring pattern 3 to be exposed outside when the upper portion of the isolation layer is removed in forming of the gate lines.

Figure 11:
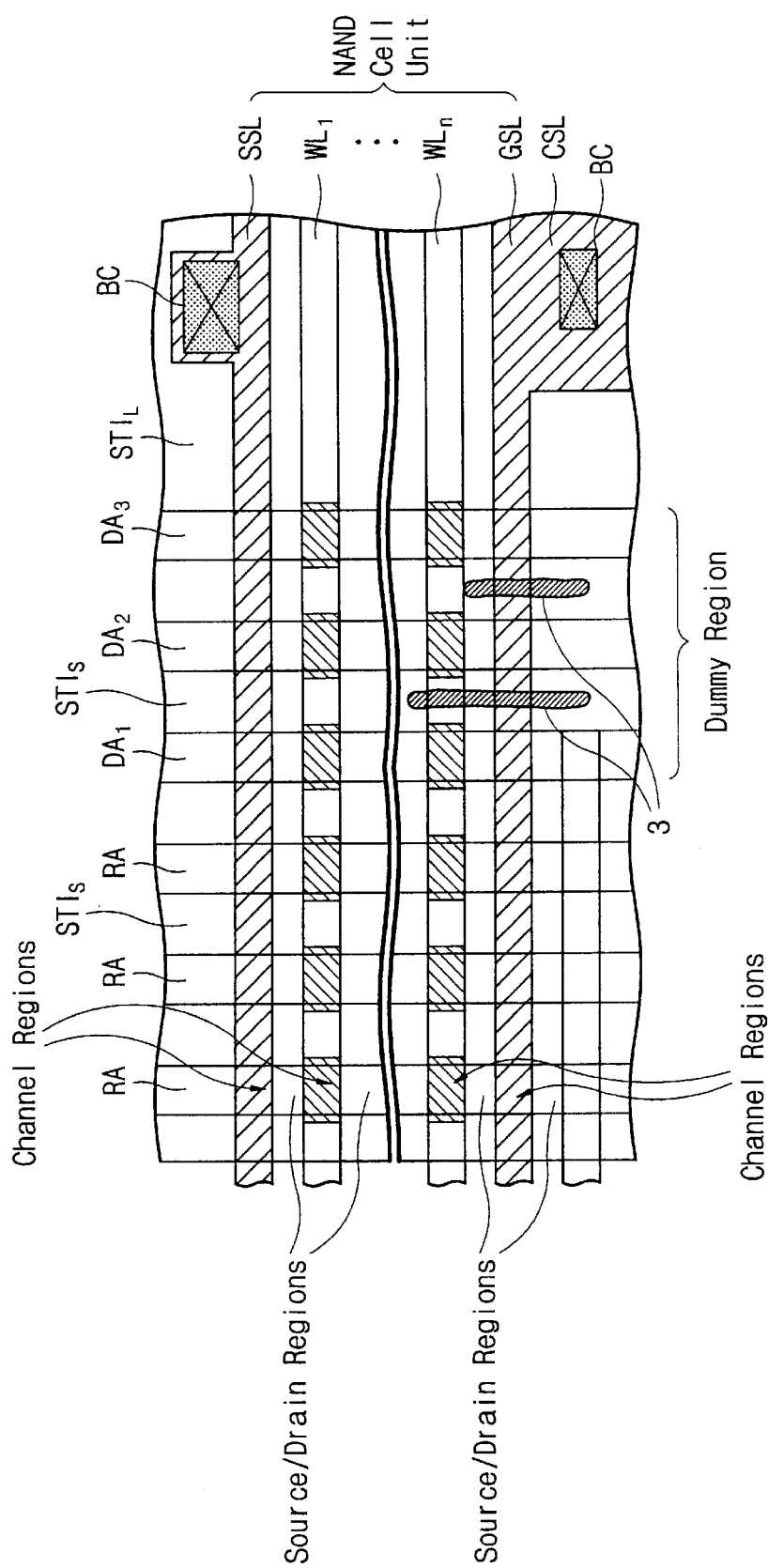

Referring to FIG. 11, in a state that the gate lines are formed and the potential wiring pattern 3 in the isolation layer between the line shaped sub-regions DA1 to DA3 of the active region forming the dummy region is exposed partially, an interlayer insulating layer is deposited. Thereafter, a groove is formed in the interlayer insulating layer through a patterning process of removing the interlayer insulating layer in a region in which a common source line CSL is to be formed. However, the groove is formed to pass only through the line shaped sub-regions RA of the active region forming the normal pattern and the narrow portion STIs of the isolation layer therebetween. Therefore, the potential wiring pattern 3 formed in the voids 3' is not exposed, but covered with the interlayer insulating layer.

Next, a silicon layer, for example a polysilicon layer is deposited over the whole surface of the substrate to fill the groove. Then, the silicon layer is planarized to expose the interlayer insulating layer. As a result, the wall shaped common source line CSL filling the groove is formed. A lower end of the common source line is not in contact with the narrow portions STIs of the isolation layer between the line shaped sub-regions DA of the active region forming the dummy pattern and the potential wiring pattern 3 formed therein, but the line shaped sub-regions RA of the active region forming the normal pattern and the narrow portions STIs of the isolation layer adjacent thereto.

At this time, the potential wiring pattern 3 is not connected electrically with the common source line CSL, but is connected to the floating gate layer of the ground select line GSL, so that a short circuit between the common source line CSL and the ground select line GSL is not occurred.

Figure 13:
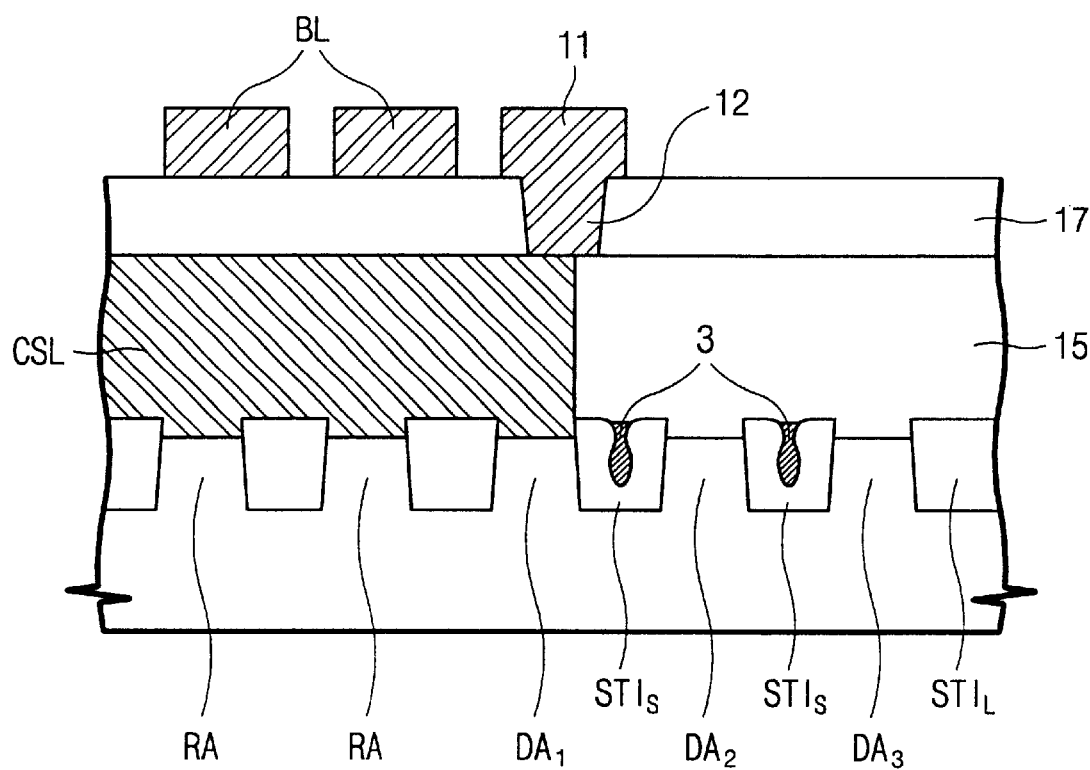
FIG. 13 is a cross-sectional view taken along the same line of FIG. 12 as line II—II of FIG. 5.

Referring to FIG. 12 and FIG. 13, an additional insulating layer 17 is formed over the substrate over which the interlayer insulating layer 15 and the common source line CSL are formed. Then, contact holes are formed through the interlayer insulating layer 15 and the additional insulating layer 17 to expose a given region on the opposite side of a side of the string select line SSL adjacent to the word lines WL, i.e., a portion of drain regions of transistors corresponding to junction regions which the line shaped sub-regions RA of the active region forming the normal pattern are crossed with the string select line SSL. Alternatively, in forming of the common source line, pads can be first formed in the interlayer insulating layer 15, and in this step, only contact holes in the additional insulating layer 17.

Thereafter, a conductive layer such as a metal layer is deposited and patterned to form the bit line BL. At this time, the conductive layer is filled in the contact holes, so that bit line contacts 13 connected with drains of transistors on the string select line SSL are also formed. The bit lines BL are overlapped with the line shaped sub-regions RA of the active region, but insulated therefrom by means of the additional insulating layer 17.

At this time, on the line shaped sub-regions DA of the active region forming the dummy region, the bit line BL is not formed. However, an united source wiring 11 instead of the bit line BL can be formed on one line shaped sub-region DA1 of the active region in the dummy region forming the dummy pattern adjacent to the normal pattern. The united source wiring 11 arranged parallel to the bit lines BL functions to connect many common source lines formed in the flash memory device. The common source line CSL is extended to the line shaped sub-region DA1 of the active region in the dummy region adjacent to the normal pattern and connected with the united source wiring 11. A contact hole for the united source wiring 11 is formed in the additional insulating layer 17 at a region in which the common source line CSL is crossed with the line shaped sub-region DA1 of the active region forming the dummy pattern when the contact holes for the bit lines BL are formed as described above. Thereafter, when the conductive layer for forming the bit lines BL is deposited and patterned, it is also filled in the contact hole for the united source wiring 11, so that a contact 12 connecting the common source line CSL with the united source wiring 11 is formed.

As apparent from the foregoing description, it can be appreciated that the present invention provides an improved flash memory device which can prevent a short circuit between a common source line and a ground select line due to voids formed in an isolation layer in a dummy region from being occurred.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A NAND type flash memory device comprising:
   an isolation layer having a plurality of line shaped portions formed parallel to each other on a substrate;
   an active region having a plurality of line shaped sub-regions defined by the isolation layer, each having a plurality of channel regions and a plurality of source/drain regions alternately formed on the substrate in a cell area;
   at least one common source line connected electrically with at least one of said source/drain regions and with a first portion of said line shaped sub-regions of said active region, and crossing at least said first portion of said line shaped sub-regions of said active region;
   at least one group of gate lines formed to cross said line shaped sub-regions of said active region, the at least one group of gate lines comprising a ground select line, a plurality of word lines, and a string select line arranged in parallel to the common source line, to form gate electrodes insulated from said channel regions by a gate insulating layer in said channel regions on junction regions which cross said line shaped sub-regions of said active regions; and
   a second portion of said line shaped sub-regions of said active regions being formed of a dummy region forming a dummy pattern, and said common source line being formed to cross only said line shaped portion of said isolation layer which are in contact with said first portion of line shaped sub-regions of said active regions forming a normal pattern except said dummy pattern.

2. The NAND type flash memory device according to claim 1, further including a plurality of bit lines connected through contacts with said first portion of said line shaped sub-regions of said active regions forming said normal pattern on the opposite side of said string select lines adjacent to said word lines, and arranged parallel to said first portion of said line shaped sub-regions of said active region.

3. The NAND type flash memory device according to claim 1, wherein said active region is divided into a plurality of blocks, and said dummy pattern is formed at both sides of said blocks.

4. The NAND type flash memory device according to claim 3, wherein said blocks are divided on the basis of said line shaped portions of said isolation layer having wide widths on which butted contacts are formed.

5. The NAND type flash memory device according to claim 3, wherein the width of said line shaped sub-regions of said active region of said dummy pattern adjacent to said normal pattern is narrower than that of said dummy pattern remote from said normal pattern.

6. The NAND type flash memory device according to claim 1, wherein the number of said word lines is one selected from 8, 16, and 32.

7. The NAND type flash memory device according to claim 1, wherein said common source line is formed of a wall shape having a lower end which is in contact with said first portion of said line shaped sub-regions of said active regions and said line shaped portions of said isolation layer between or adjacent to said first portion of said line shaped sub-regions of said active region at a region in which said common source line is formed.

8. The NAND type flash memory device according to claim 1, wherein said ground select lines are formed by patterning the same polysilicon layer as that of floating gates of said word line.

9. The NAND type flash memory device according to claim 1, wherein said isolation layer is formed by using CVD process through STI process.

10. The NAND type flash memory device according to claim 2, wherein said common source line is formed to be overlapped with at least a portion of dummy pattern adjacent to said normal pattern; and wherein at least one united source wiring formed along with and parallel to said bit lines is connected with said common source line through contacts formed to include at least a portion of said overlapped portion of said dummy pattern.

11. The NAND type flash memory device according to claim 3, wherein the width of said line shaped portions of said active region of said dummy pattern adjacent to said normal pattern is narrower than that of said dummy pattern remote from said normal pattern.

* * * * *